(12) United States Patent
Rahtu

(10) Patent No.: US 8,048,484 B2
(45) Date of Patent: Nov. 1, 2011

(54) METHOD FOR THE DEPOSITION OF A FILM BY CVD OR ALD

(75) Inventor: Antti H. Rahtu, Vantaa (FI)

(73) Assignee: ASM International N.V., Almere (NL)

( * ) Notice: Subject to any disclaimer, the term of this patent is extended or adjusted under 35 U.S.C. 154(b) by 1181 days.

(21) Appl. No.: 11/600,299

(22) Filed: Nov. 15, 2006

(65) Prior Publication Data

US 2007/0123060 A1    May 31, 2007

Related U.S. Application Data

(60) Provisional application No. 60/737,732, filed on Nov. 16, 2005.

(51) Int. Cl.
*C23C 16/00* (2006.01)
(52) U.S. Cl. .................................. 427/248.1
(58) Field of Classification Search ............... None
See application file for complete search history.

(56) References Cited

U.S. PATENT DOCUMENTS

| | | | |
|---|---|---|---|
| 6,174,809 B1* | 1/2001 | Kang et al. ................ | 438/682 |
| 6,470,144 B1* | 10/2002 | Tarutani et al. ............. | 392/396 |
| 6,599,572 B2* | 7/2003 | Saanila et al. ............. | 427/249.18 |
| 6,984,591 B1* | 1/2006 | Buchanan et al. .......... | 438/778 |
| 6,984,951 B2 | 1/2006 | Buchanan et al. | |
| 7,030,450 B2 | 4/2006 | Lee et al. | |
| 2001/0012700 A1* | 8/2001 | Schuegraf .................. | 438/790 |
| 2001/0054769 A1* | 12/2001 | Raaijmakers et al. ...... | 257/758 |
| 2002/0086504 A1* | 7/2002 | Park et al. ................. | 438/580 |
| 2002/0192899 A1* | 12/2002 | Shimamoto et al. ........ | 438/240 |
| 2003/0008072 A1* | 1/2003 | Lee et al. .................. | 427/255.28 |
| 2003/0072975 A1* | 4/2003 | Shero et al. ............... | 428/704 |
| 2003/0082296 A1* | 5/2003 | Elers et al. ................ | 427/96 |
| 2003/0168001 A1* | 9/2003 | Sneh .......................... | 117/86 |
| 2004/0043228 A1* | 3/2004 | Derderian et al. ......... | 428/446 |
| 2004/0087143 A1* | 5/2004 | Norman et al. ............ | 438/680 |
| 2004/0113195 A1* | 6/2004 | Lee et al. .................. | 257/310 |
| 2004/0126485 A1* | 7/2004 | Thompson et al. ........ | 427/126.5 |
| 2004/0254065 A1* | 12/2004 | Rodriquez et al. ........ | 502/150 |
| 2006/0257689 A1* | 11/2006 | Sottke et al. .............. | 428/698 |

OTHER PUBLICATIONS

Dewald, J. of the American Chemical Society, 90:2, Jan. 1968, p. 533-34.*
Klaus et al., "Atomic Layer Deposition of $SiO_2$ Using Catalyzed and Uncatalyzed Self-Limiting Surface Reactions," Surface Review and Letters 6(3): 435-448 (1999).
Klaus et al., "Growth of $SiO_2$ at Room Temperature with the Use of Catalyzed Sequential Half-Reactions," Science 278: 1934-1936 (1997).
Park et al., "Mass-Productive Ultra-Low Temperature ALD $SiO_2$ Process Promising for Sub-90nm Memory and Logic Devices," IEDM: 229-232 (2002).

* cited by examiner

*Primary Examiner* — Timothy Meeks
*Assistant Examiner* — Joseph Miller, Jr.
(74) *Attorney, Agent, or Firm* — Knobbe Martens Olson & Bear LLP

(57) ABSTRACT

Methods and apparatus for deposition of a film on a substrate in a reaction chamber by an atomic layer deposition (ALD) or chemical vapor deposition (CVD) process include providing one or more reactants, and providing a volatile neutral coordinating ligand capable of coordinating at least one selected from the following: (i) one of the reactants; (ii) a reaction by-product formed during the deposition process. The neutral coordinating ligand thus improves volatility of either reactants and/or by-products, either in the gas phase or aiding in removal of species from reaction space surfaces. The neutral coordinating ligand is provided during the deposition process, either during or after reactant supply.

23 Claims, 2 Drawing Sheets

METHOD FOR THE DEPOSITION OF A FILM BY CVD OR ALD

REFERENCE TO RELATED APPLICATIONS

The present application claims priority to U.S. Provisional Application No. 60/737,732, filed Nov. 16, 2005, which is incorporated by reference herein.

FIELD OF THE INVENTION

The invention relates to the field of film deposition process by Chemical Vapor Deposition (CVD) and Atomic Layer Deposition (ALD).

BACKGROUND OF THE INVENTION

In ALD and CVD deposition processes, often reactants are used that have a very low vapor pressure. First of all this is a problem as it becomes difficult to transport the reactant into the reactor. Furthermore, after the reactant exposure step it will be difficult to remove the reactant from the reaction chamber by purging of evacuation.

Slow purging of low vapor pressure reactants is particularly problematic for an ALD process where repeated and alternating pulses of at least two reactants are used and where it is important that the reactants remain separated. Exemplary processes are deposition processes for metal oxides which are going to be used as a high-k gate oxide material in MOSFET structures. ALD is a preferred technique to deposit films in a controllable manner by sequential and alternating pulses of at least two mutually reactive reactants. Metal halides are suitable metal source chemicals for ALD as they can easily be produced and are thermally stable and they tend to react strongly with water vapor at low temperatures. For $HfO_2$, a frequently used high-k material, the best material properties are obtained with $HfCl_4+H_2O$ as reactants, as compared to processes using other Hf-containing source materials such as metal-organic Hf compounds. The main drawback of many metal chlorides is their relatively low vapor pressure. Usually source temperatures around 150-200° C. are required to create sufficient vapor pressure for transportation of the reactant from the source container to the reactor. Even at these temperatures the vapor pressure is relatively low. This makes the reactor design very challenging and the removal of $HfCl_4$ by purging and/or evacuation difficult.

The vapor pressure of molecules is affected by several different factors, such as: i) the molecular weight; ii) tendency to polymerization; and iii) intermolecular bonds. $HfCl_4$ has a particularly low vapor pressure, particularly when its molecular weight is compared to other precursors. The molecular weight of $HfCl_4$ is 320.5 g/mol and its vapor pressure is only 1 torr at 190° C. By way of comparison, the molecular weight of $WF_6$ is similar to that of $HfCl_4$, 297.8 g/mol, but $WF_6$ has a much larger vapor pressure of 860 Torr at 21° C. The reason is that $HfCl_4$ has a non-saturated coordination. Hafnium is a relative large metal and thus most of its compounds have a high coordination number. The most usual coordination number for Hf is eight [Chemistry of the Elements, Greenwood, N. N.; Earnshaw, A; © 1997 Elsevier]. Monomeric $HfCl_4$ would have a coordination number of four. This is too low for hafnium and thus it will tend to make coordination bonds to other $HfCl_4$ molecules so that the coordination sphere gets saturated. This results in a dramatic reduction in vapor pressure.

It is possible that the vapor pressure of a reactant is high but nevertheless it has a non-saturated coordination. Examples are molecules having a lone pair of electrons, such as $H_2O$ and $NH_3$. These molecules also have a strong tendency to increase their coordination number and therefore they have a strong tendency to stick to the reactor walls. Additionally, reaction by-products generated in the film deposition process might have a non-saturated coordination and corresponding tendency to stick to the reactor wall.

Consequently, in film deposition processes using vapor phase reactants with a non-saturated coordination, or generating reaction by-products with a non-saturated coordination there is a need for a method to prevent non-saturated molecules from forming coordinating bonds by sticking to the reactor walls or by forming bonds with other molecules of the same kind to increase their coordination number.

SUMMARY OF THE INVENTION

In one aspect, the invention provides methods for improving deposition of a film on a substrate in a reaction chamber by a vapor phase deposition process, such as an atomic layer deposition (ALD) or chemical vapor deposition (CVD) process, in which two or more reactants are provided to the reaction chamber. The methods preferably comprise providing a volatile neutral coordinating ligand capable of coordinating to at least one of (i) one of the reactants; and (ii) a reaction by-product formed during the deposition process. In some embodiments the reactivity enhancer improves deposition, compared to a deposition process in which a neutral coordinating ligand is not provided, by improving film uniformity, improving pulsing or purging efficiency and/or reducing particle levels in the films. The neural ligand preferably does not contaminate the growing film. In some embodiments, for example, CVD reactions in an ALD process are reduced by the use of a neutral coordinating ligand, thus increasing uniformity.

In some embodiments the neutral coordinating ligand is selected from the group consisting of furan, tetrahydrofuran, dioxane, thiophene, tetrahydrothiophene and derivatives thereof. In other embodiments the neutral coordinating ligand is selected from the group consisting of carboxylic acids, alkenes and alkynes.

In another aspect of the invention, methods are provided for the deposition of a film on a substrate in a reaction chamber by atomic layer deposition (ALD). The ALD process preferably comprises a deposition cycle in which pulses of a first and second reactant are supplied to the reaction chamber in a sequential and alternating manner, the first and second reactants being mutually reactive. Excess reactant and reaction by-products, if any, are removed between reactant pulses. The cycle is repeated to form a film of the desired thickness. A reactivity enhancing volatile neutral coordinating ligand is preferably supplied to the reactor during the supply of the first reactant and/or after the supply of a pulse of the first reactant but before the supply of the subsequent pulse of the second reactant. The ligand can coordinate to one of the reactants and/or to a reaction by-product formed by a reaction between the first and second reactants. The reactivity enhancer is preferably provided less than once per cycle. For example, the reactivity enhancer may be provided every $2^{nd}$ cycle to every $100^{th}$ cycle.

In accordance with another aspect of the invention, a vapor deposition process comprises providing a metal precursor that provides at least one metal to be incorporated into the deposited film and a second chemical that increases the volatility of the metal precursor. Preferably the second chemical comprises a neutral coordinating ligand.

In accordance with another aspect of the invention, an apparatus configured for atomic layer deposition (ALD) or chemical vapor deposition (CVD) is provided. The apparatus includes a source of neutral coordinating ligands connected to a reaction space of the apparatus, wherein the neutral coordinating ligands increase volatility of at least one precursor or by-product of the ALD or CVD process to be performed in the reactor.

DETAILED DESCRIPTION OF THE PREFERRED EMBODIMENTS

Figure 1:
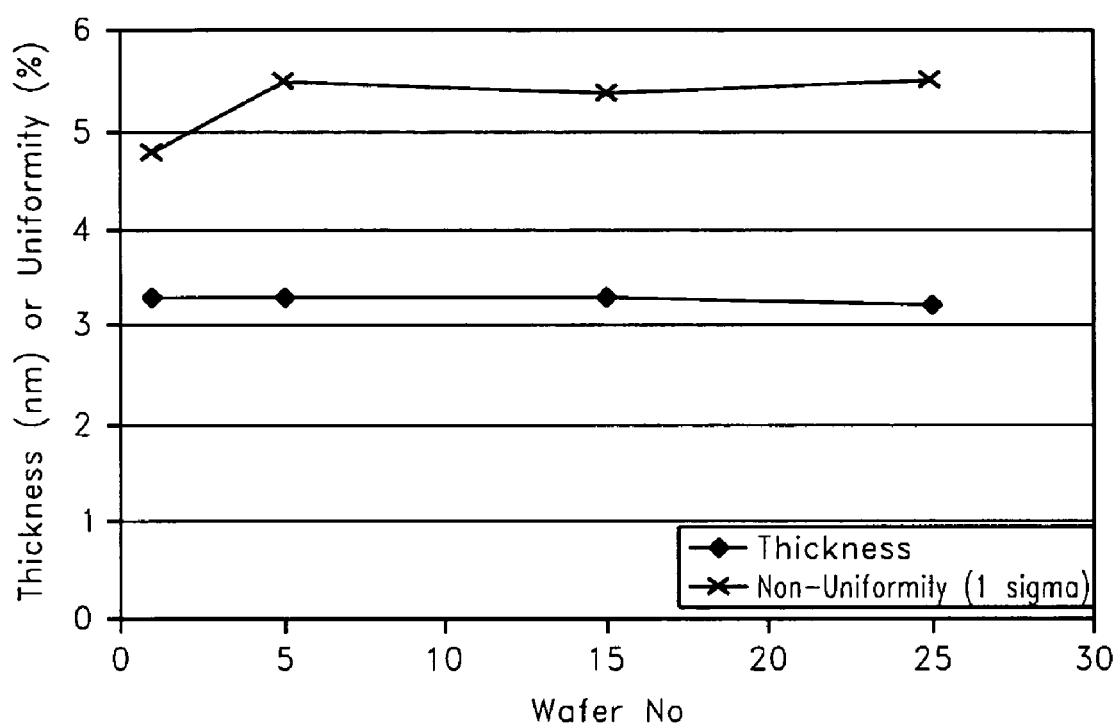
FIG. 1 shows the film thickness and uniformity of a prior art ALD process.

In order to prevent a reactant molecule from forming coordination bonds to other heavy molecules, resulting in low volatility, the coordination sphere can also be saturated by neutral ligands. A neutral ligand is in general a molecule that is capable to bond to a central atom or ion, usually a metal, of another molecule through a coordination bond. The coordination bond is formed upon interaction between the ligand and the other molecule wherein the ligand serves as the donor and the other molecule as the acceptor of an electron pair shared in the complex formed. Neutral ligands have been used in the synthesis of several compounds for making precursors more volatile. One well known example is Cu(HFAC)TMVS, marketed under the trademark Cupraselect™ by Air Products. The problem with neutral coordinating ligands is that the bond strength to the central atom is usually much weaker than for ligands that are bonded with covalent or ionic bonds, and thus the thermal stability of the molecules is limited. This means that the life time of the compound with neutral coordinating ligands can be relatively short. The life time can further be reduced in the processing environment because the source container temperature is in most cases above room temperature. Therefore, in a production environment, synthesized compounds having neutral coordinating ligands can often not be used.

In the methods described herein, a neutral coordinating ligand from a separate source is provided in deposition process that uses a reactant having a non-saturated coordination sphere or that generates a by-product having a non-saturated coordination sphere. The neutral coordinating ligands are considered to be delivered to the reaction chamber or reaction space whether provided directly to the reaction chamber/space (in separate pulses or with a precursor) or whether mixed with a precursor upstream of the reaction chamber/space. The coordinating ligand will supersede the self-coordination among molecules of the reactant or by-product coordination to reactor space surfaces. As a result, the volatility of the reactant significantly increases. An advantage of the use of neutral coordinating ligands in an ALD process is that "sticking" of a low-volatility reactant to the reaction chamber surfaces, which can result in CVD growth, is reduced, allowing better film uniformities, lower particle levels and shorter purging times.

In one embodiment, a precursor and neutral coordinating ligands are "mixed" temporally and spatially close to, or within, the reaction space that houses one or more substrates. Preferably, the point of mixing is less than 5 m, and more preferably less than 2 m from the reaction space. Preferably, mixing takes place less than 60 seconds, and more preferably less than 10 seconds, before the mixture is introduced into the reaction space. It will be understood that "mixing" in this sense includes either gas phase mixing or being supplied to the same reaction space subsequent to a precursor pulse, in which case the "mixing" is often with adsorbed species on the reaction space surfaces.

Although the life time of "in-situ" formed compounds with neutral coordinating ligands remains limited, even a limited life time at process temperature of this compound is enough, because the residence time of the precursors in the deposition chamber is short. Preferably, the life time of the compound is longer than the residence time in the reaction chamber and transport time (if any) from the point of mixing the precursor and source of neutral coordinating ligands, so that unreacted compound is purged away before the coordination bonds are broken. However, because the presence of an excess of ligands tends to stabilize the compound it is possible that the volatilization and transport occurs in several steps where coordination bonds are formed, broken and new coordination bonds are formed again. In this way, advantages are obtained even if the life-time of the first formed compound with neutral coordination ligands is shorter than the residence time of the gas in the reaction chamber. A typical residence time is in the range of 0.1 to 1 seconds. The typical temperatures for ALD processing are in the range of 100° C. to 400° C.

Suitable neutral coordinating ligands should be volatile, non-reactive at the deposition temperature and have a high tendency to coordinate, i.e., comprising one or more lone pair of electrons. Molecules comprising a chain of carbon bonds with at least one double or triple carbon-carbon bond are suitable. Preferably, these molecules comprise a hetero-atom (in the examples, a non-carbon atom) having a lone pair of electrons and the carbon chain and hetero-atom form together a ring structure of 5 or 6 atoms. The lone pair of electrons has a high capability of forming coordination bonds. The incorporation in a ring makes the hetero-atom much more accessible than such a hetero-atom in the middle of a linear chain. Suitable hetero-atoms are O, S, P and N. The presence of double carbon-carbon bonds in a ring structure results in the delocalization of electrons and in improvement of the thermal stability.

In particular furan ($C_4H_4O$), tetrahydrofuran (THF, $C_4H_8O$), dioxane ($C_4H_8O_2$), thiophene ($C_4H_4S$), tetrahydrothiophene ($C_4H_8S$), $C_4H_4P$, pyridine ($C_5H_5N$) or derivatives of those are suitable ligands for this purpose. Other possible ligands include triphenyl phosphine, tributylphosphine, tetramethylethanediamine (TMEDA), and tetramethylpropanediamine (TMPDA). In some embodiments the ligand is selected from the group consisting of tetrahydrofuran, dioxane, thophene, tetrahdrothiophene and derivatives thereof. The structure of some of these materials is shown in Table 1.

TABLE 1

| Name | CAS Number | Vapor Pressure |
|---|---|---|
| Furan ($C_4H_4O$) | 110-00-9 | 500 Torr @ 20° C. |
| Tetrahydrofuran (THF) ($C_4H_8O$) | 109-99-9 | 140 Torr @ 20° C. |
| Thiophene ($C_4H_4S$) Thiofuran | 110-02-1 | 40 Torr @ 13° C. |
| Tetrahydrothiophene ($C_4H_8S$) | 110-01-0 | 18 Torr @ 25° C. |
| Pyridine ($C_5H_5N$) | 110-86-1 | 20 Torr @ 25° C. |

THF (tetrahydrofuran, $C_4H_8O$) is very volatile (129 torr at 20° C.), and the oxygen's lone pair of electrons coordinate easily. Furan ($C_4H_4O$) has a delocalized electron ring because of two double carbon-carbon bonds, which makes it thermally stable and also the oxygen's lone pair of electrons coordinates easily. In addition, the relatively small size makes coordination easier. In the examples shown in Table 1, a hydrogen atom is attached to each carbon atom. Alternatively, one or more hydrogen atoms can be replaced by alkyl groups such as methyl or ethyl groups or by alkoxy or amino groups. Nevertheless, it is believed that it is advantageous to select ligands that are as small and simple as possible. Larger ligands could also be used but those can have some problems in coordinating because of steric hindrance. However, in cases where there are several hetero-atoms in the coordinating ligands, it may reduce the effect of steric hindrance and thus those precursors could be utilized.

Crown ethers or epoxides, and corresponding compounds of those, where one or more or all oxygen atoms are replaced with sulphur, phosphorus and nitrogen, could also be used.

General formula I for the ring structured or epoxy structured coordinating ligand with a hetero-atom is presented below:

(I)

where, $R^1$ and $R^2$ can be independently selected from:
  linear or branched $C_1$-$C_{20}$ alkyl, alkenyl or alkynyl groups or hydrogen;
  halogenated alkyl, alkenyl or alkynyl groups, wherein at least one hydrogen atom is replaced with fluorine, chlorine, bromine or iodine atom;
  alkyl, alkenyl or alkynyl groups with substituted (hydrogen atom(s) replaced with) double-bonded O, S or N or triple-bonded N;
  alkyl, alkenyl or alkynyl groups substituted with (one hydrogen atom replaced with) a substituent selected from the group of —$NH_2$, —$SH_2$, —OH; and
  X can be any hetero-atom independently selected from the group consisting of O, S, N and P.

General formula II for a ring structured (e.g., crown ethers and dioxane) coordinating ligand with more than one hetero-atom is presented below:

(II)

where, n can be any number from 1 to 20;
  $R_1$ and $R_2$ can be independently selected from
  linear or branched $C_1$-$C_{20}$ alkyl, alkenyl or alkynyl groups or hydrogen;
  halogenated alkyl, alkenyl or alkynyl groups, wherein at least one hydrogen atom is replaced with fluorine, chlorine, bromine or iodine atom;
  alkyl, alkenyl or alkynyl groups with substituted double-bonded O, S or N or triple-bonded N;
  alkyl, alkenyl or alkynyl groups with substituted (e.g., one hydrogen atom replaced with) a substituent selected from the group of —$NH_2$, —$SH_2$, —OH; and
  X can be any hetero-atom independently selected from the group consisting of O, S, N and P.

In the example of $HfO_2$ deposition from $HfCl_4$ and $H_2O$, the affinity of hafnium towards oxygen is greater than its affinity towards chlorine. Therefore, when THF is used as coordinating ligand, the Hf atom will have a preference to be coordinated by the O atoms of THF ligands instead of by Cl atoms of neighboring $HfCl_4$ atoms. On the other hand, the bonds between hafnium and coordinating ligands such as THF are almost always weaker than the covalent or ionic bonds present in hafnium oxide, so the next water pulse in an ALD process will remove all the coordinating ligands.

An alternative group of neutral ligands are carboxylic acids, having a carbon atom with a double-bonded O and an OH group. Examples are formic acid (COOH), acetic acid ($CH_3COOH$) and propanoic acid ($CH_3CH_2COOH$).

An alternative group of neutral ligands for coordination purposes are carbon chains with a double carbon-carbon bond (alkenes), such as ethene ($C_2H_4$), propene ($C_3H_6$), butene ($C_4H_8$), and butadiene ($C_4H_6$), or triple carbon-carbon bonds (alkynes or acetylenes), e.g., ethyne, ($C_2H_2$), propyne ($C_3H_4$), and butyne ($C_4H_6$).

An example is presented for the $HfCl_4$-THF case. However, it will be understood that the principles taught herein will be beneficial for other metal and nonmetal precursors and other adducts also. Examples of other metal precursors for which the invention can be beneficially used are fluorides, chlorides, bromides and iodides of Ti, Zr, Hf, V, Nb, Ta, Cr, Mo, W, Ru, Co, Rh, Ir, Ni, Cu, Pd, Pt, Al, Ga, In, and Ge. In some embodiments the precursor can comprise Si.

In preferred embodiments the deposition reactions utilize a metal precursor. Preferably the metal precursor does not comprise silicon. However, the principles taught herein can also be beneficial for non-metal precursors, such as water and ammonia. Although these precursors have a high volatility, due to a lone pair of electrons of the central atom, or the hydrogen bonding, these molecules are very "sticky," i.e. they are difficult to purge out of the reaction chamber. The addition of a coordinating ligand will help in this case. The same neutral coordinating ligands can be used as those suggested above.

In other cases a reaction by-product might be difficult to purge. An example is $NH_4Cl$, which is likely formed in processes using metal chlorides and $NH_3$:

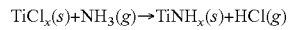

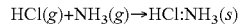

In this case it is proposed to feed pyridine simultaneously with $NH_3$ so that the HCl formed will be coordinated by pyridine:

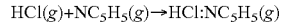

The vapor pressure for pyridine hydrochloride is 750 Torr at 220° C., while the vapor pressure for ammonium chloride is 1 Torr at 160° C.

An alternative group of neutral ligands for coordination purposes are carbon chains with a double carbon-carbon bond (alkenes) such as ethene ($C_2H_4$), propene ($C_4H_6$) and butene ($C_4H_8$), or triple carbon-carbon bonds (alkynes or acetylenes) such as ethyne, ($C_2H_2$), propyne ($C_3H_4$), and butyne ($C_4H_6$). Ring structured carbon chains, like benzene, cycloheptene or cyclopentadienyl, that have at least one double bond or delocalized electrons, can also be used.

In an ALD process the coordinating ligand can be fed to the reaction chambers in various ways. The coordinating ligand and the low volatility reactant can be fed to the reaction chamber simultaneously but from separate sources and via a separate flow paths. The coordinating ligand can also flow through the container of the low volatility reactant so that it functions as a carrier gas for the low volatility reactant. Another possibility is to feed the coordinating ligand to the reaction chamber after the pulse of the low volatility reactant, and prior to feeding the directly subsequent pulse of the second reactant, to ensure an efficient purging of the reaction chamber.

An ALD process typically comprises multiple deposition cycles, where in each cycle two or more reactants are alternately and sequentially provided. In some embodiments, the coordinating ligand is not fed to reaction chamber in every cycle, but it can be fed from every $2^{nd}$ to every $100^{th}$ cycle, or even less frequently. It will be clear that also combinations of these ways are also possible.

EXAMPLE

Figure 2:
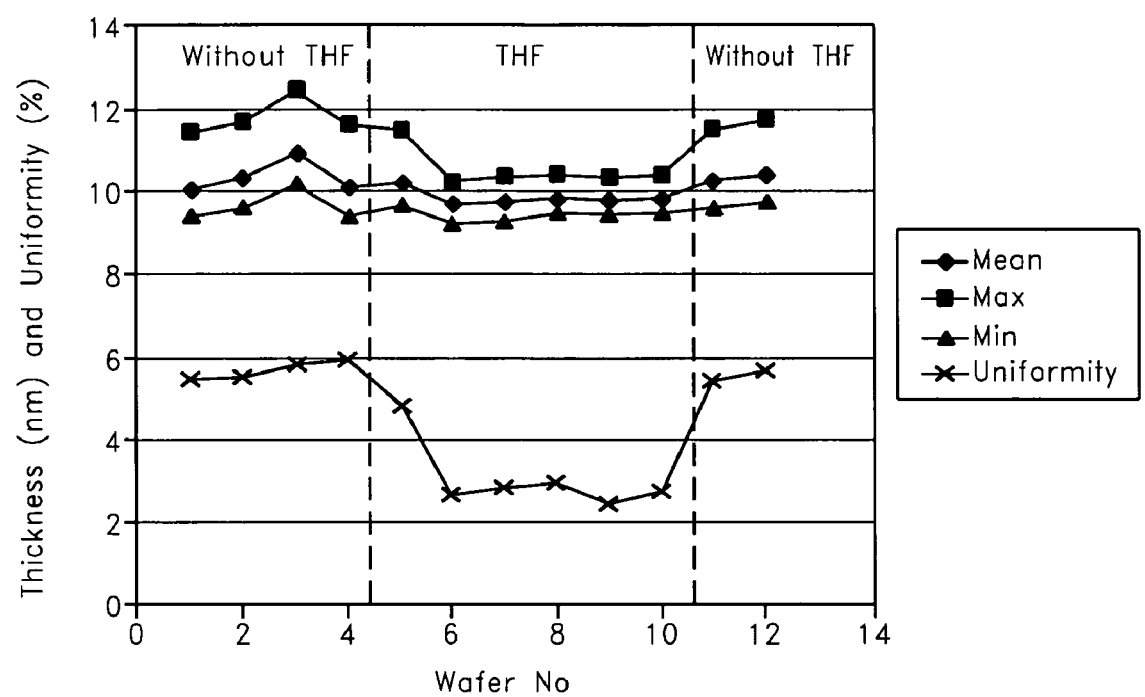
FIG. 2 compares the film thickness and uniformity of an ALD process with and without the use of THF as a neutral coordinating ligand.

An example of the invention is the deposition of $HfO_2$ from $HfCl_4$ and $H_2O$, using THF as the neutral coordinating ligand. FIG. 2 shows the film thickness and uniformity for a number of wafers processed sequentially in an F-200ALD reactor, commercially available from ASM International N.V. of Bilthoven, The Netherlands, at a process temperature of 300° C. according to the prior art, without the use of a neutral coordinating ligand. A reproducible thickness was achieved. The variation in film thickness over the wafer is however relatively large at a level of 5% (1 sigma). In FIG. 3, the effect of the use of THF as described herein is shown. The THF was fed into the reaction chamber both after the $HfCl_4$ pulse and after the water pulse. The uniformity is improved from about 6% to below 3% (1 sigma). The minimum thickness on the wafer is not affected by the use of THF. It is believed that by the use of THF a better purging efficiency is achieved, resulting in more complete removal of any $HfCl_4$ or $H_2O$ from the reactor before the next pulse enters. Without THF, traces of $HfCl_4$ or $H_2O$ are left, giving rise to some CVD growth in localized areas, resulting in higher maximum thicknesses. From the unchanged minimum thickness it can be concluded that THF does not affect the film deposition process itself; it does not decompose and does not affect the film composition.

It will be clear that the application of the principles described herein is not limited to ALD processes with two reactants only but can also beneficially applied in ALD processes employing three or more reactants. Furthermore, the principles described herein can be applied to ALD processes operated in single wafer reactors as well as in batch reactors. In vertical batch reactors, comprising a stack horizontally oriented and vertically spaced wafers in a vertically elongated reaction chamber, such as described in U.S. Pat. No. 6,585,823 of applicant, the purging efficiency is rather low and the methods described herein can be beneficially applied. Finally, it can also be practiced in CVD. In low pressure CVD (LPCVD) processes the residence time of the gases in the reaction chamber is similarly short as in ALD. Although the purging efficiency in CVD is much less critical than in ALD, a neutral coordinating ligand can assist in transporting a low vapor pressure reactant into the reaction chamber.

It will be appreciated that apparatuses in accordance with the teachings herein, whether ALD, CVD, single-wafer or batch, preferably include a source of neutral coordinating ligands, as described herein, connected to the apparatus in such a fashion that mixture between a precursor for film deposition and the neutral coordinating ligands occurs either in proximity with the reaction space or within the reaction space. The tool is configured for dynamic "mixture" during processing (e.g., while flowing the precursor and neutral coordinating ligands to the reaction space or in separate neutral coordinating ligand pulses between precursor pulses as described above). When separate ligand pulses are employed, the "mixture" is with residual precursor or by-product, in the gas phase and/or on reaction space surfaces. The reaction space is commonly understood to include the reaction chamber itself, and those inlets and outlets in immediate communication therewith, such as in the case of an ALD reactor, those surfaces subject to both or all ALD precursors. ALD reactors, of course, will include valves and control processors programmed or otherwise configured to allow alternating and exclusive pulses of precursors through the reaction space, typically with removal steps such as purging between precursor pulses.

Various modifications and alterations of this invention will be apparent to those skilled in the art without departing from the scope and spirit of this invention. It is to be understood that the invention is not limited to the embodiments disclosed herein, and that the claims should be interpreted as broadly as the prior art allows.

I claim:

1. A method for improving deposition of a film on a substrate in a reaction chamber by a vapor deposition process in which two or more reactants are provided to the reaction chamber, wherein one of the reactants comprises a metal halide, the method comprising:
   providing a volatile neutral coordinating ligand selected from the group consisting of furan, tetrahydrofuran, dioxane, thiophene, tetrahydrothiophene and derivatives thereof to the reaction chamber from a source separate from a reactant source;
   contacting the ligand with the metal halide; wherein the ligand is capable of coordinating to the metal halide, and wherein the vapor deposition process is an atomic layer deposition process.

2. The process of claim 1, wherein the uniformity of the film is improved compared to a deposition process in which a neutral coordinating ligand is not provided.

3. A method for deposition of a film onto a substrate in a reaction chamber by atomic layer deposition (ALD) comprising:
   multiple deposition cycles, each cycle comprising providing separated vapor phase pulses of a first and a second reactant to the reaction chamber in a sequential and alternating manner; the first and second reactants being mutually reactive, wherein one of the first and second reactants comprises a halide; and
   supplying a vapor phase neutral coordinating ligand to the reaction chamber from a source separate from a reactant source during the process of supplying one or more of the separated pulses of the first and second reactant, wherein the neutral coordinating ligand is capable of coordinating to either one or both of the reactants or to a reaction by-product formed by a reaction between the first and second reactants, and wherein the neutral coordinating ligand is not provided in every deposition cycle.

4. The method of claim 3, wherein the neutral coordinating ligand is provided every $2^{nd}$ to $100^{th}$ deposition cycle.

5. The method of claim 4, wherein the neutral coordinating ligand is provided every other deposition cycle.

6. The method of claim 3 wherein the neutral coordinating ligand comprises a carbon chain with at least one double or triple carbon-carbon bond.

7. The method of claim 6 wherein the ligand further comprises a heteroatom, and the hetero-atom and the carbon chain together form a ring structure.

8. The method of claim 7 wherein the ring comprises 5 or 6 atoms.

9. The method of claim 7 wherein the heteroatom comprises a lone pair of electrons.

10. The method of claim 7 wherein the heteroatom is selected from the group of O, S, P and N.

11. The method of claim 10 wherein the neutral coordinating ligand is selected from the group of furan ($C_4H_4O$), tetrahydrofuran ($C_4H_8O$), thiophene($C_4H_4S$), $C_4H_4P$, tetrahydrothiophene ($C_4H_8S$), and pyridine ($C_5H_5N$).

12. The method of claim 6 wherein the carbon chain is an alkene comprising a double carbon-carbon bond.

13. The method of claim 12 wherein the alkene is selected from the group of ethene ($C_2H_4$), propene ($C_3H_6$), butene ($C_4H_8$) and butadiene ($C_4H_6$).

14. The method of claim 6 wherein the carbon chain is an alkyne comprising a triple carbon-carbon bond.

15. The method of claim 14 wherein the alkyne is selected from the group of acetylene ($C_2H_2$), propyne ($C_3H_4$) and butyne ($C_4C_6$).

16. The method of claim 3, wherein supplying the neutral coordinating ligand is performed during the pulse of the first reactant and pulse of the second reactant.

17. The method of claim 3, wherein supplying the neutral coordinating ligand is performed between reactant pulses.

18. The method of claim 3, wherein each deposition cycle further comprises providing at least a third reactant in pulses separated from the pulses of the first and second reactants.

19. A method for vapor deposition of a film, the method comprising:

providing a vapor phase metal halide precursor to a reaction space, wherein the precursor provides at least one metal to be incorporated into the deposited film;

providing a neutral coordinating ligand to the reaction space that increases volatility of the metal halide precursor from a source separate from a source of the at least one vapor-phase metal precursor, wherein the neutral coordinating ligand does not react with the vapor-phase metal halide precursor, wherein providing the neutral coordinating ligand comprises mixing the metal halide precursor with the neutral coordinating ligand upstream of the reaction space during deposition, and wherein the vapor deposition process comprises an atomic layer deposition process.

20. The method of claim 19, wherein providing the neutral coordinating ligand comprises pulsing the neutral coordinating ligand after pulsing the metal precursor to aid purging the reaction space of the precursor.

21. The method of claim 1, wherein the volatile neutral coordinating ligand provided to the reaction chamber is mixed with at least one of the two reactants.

22. The method of claim 19, wherein the volatile neutral coordinating ligand comprises a carbon chain and a heteroatom with the hetero-atom and the carbon chain together forming a ring structure.

23. The method of claim 1 wherein providing a volatile neutral coordinating ligand does not result in a change in a minimum film thickness on the substrate in comparison to a film deposited where a neutral coordinating ligand is not provided.

* * * * *

UNITED STATES PATENT AND TRADEMARK OFFICE
CERTIFICATE OF CORRECTION

PATENT NO. : 8,048,484 B2  
APPLICATION NO. : 11/600299  
DATED : November 1, 2011  
INVENTOR(S) : Antti H. Rahtu Page 1 of 1

It is certified that error appears in the above-identified patent and that said Letters Patent is hereby corrected as shown below:

On Column 4, Line 53, change "thophene" to --thiophene,--.

On Column 4, Line 53, change "tetrahdrothiophene" to --tetrahydrothiophene--.

On Column 5, Line 57, change "$R_1$" to --$R^1$--.

On Column 5, Line 57, change "$R_2$" to --$R^2$--.

On Column 6, Line 21, change "ethyne," to --ethyne--.

On Column 6, Line 61, change "ethyne," to --ethyne--.

On Column 8, Line 46, in Claim 3, change "manner;" to --manner,--.

On Column 9, Line 7, in Claim 11, change "10" to --6--.

On Column 9, Line 9, in Claim 11, change "thiophene($C_4H_4S$)," to --thiophene ($C_4H_4S$),--.

On Column 9, Line 21, in Claim 15, change "($C_4C_6$)." to --($C_4H_6$).--.

On Column 10, Line 21, in Claim 21, change "reactants." to --reactants within the reaction chamber.--.

Signed and Sealed this  
Twenty-eighth Day of August, 2012

David J. Kappos  
*Director of the United States Patent and Trademark Office*